(12) United States Patent
Larsen

(10) Patent No.: US 6,817,002 B2
(45) Date of Patent: Nov. 9, 2004

(54) METHOD AND APPARATUS FOR PCB ARRAY WITH COMPENSATED SIGNAL PROPAGATION

(75) Inventor: Corey L. Larsen, Marsing, ID (US)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 10/224,102

(22) Filed: Aug. 20, 2002

(65) Prior Publication Data

US 2003/0005397 A1 Jan. 2, 2003

Related U.S. Application Data

(63) Continuation of application No. 09/612,155, filed on Jul. 7, 2000, now Pat. No. 6,484,299.

(51) Int. Cl.$^7$ ............................................. G06F 17/50
(52) U.S. Cl. ................................... 716/6; 716/4; 716/5
(58) Field of Search ............................. 719/4–6, 8–15; 702/89, 117; 438/18, 404, 599, 598, 633; 711/170; 333/12, 18, 142; 327/262, 276, 277; 29/829

(56) References Cited

U.S. PATENT DOCUMENTS

| | | | |
|---|---|---|---|
| 5,785,789 A | 7/1998 | Gagnon et al. | |
| 5,839,188 A | 11/1998 | Pommer | |
| 5,892,384 A | 4/1999 | Yamada et al. | |
| 5,926,397 A | 7/1999 | Yamanouchi | |
| 5,929,199 A | 7/1999 | Snow et al. | |
| 5,945,886 A | 8/1999 | Millar | |
| 5,949,657 A | 9/1999 | Karabatsos | |
| 6,215,372 B1 | 4/2001 | Novak | |
| 6,278,239 B1 | 8/2001 | Caporaso et al. | |
| 6,291,339 B1 | 9/2001 | Avanzino et al. | |
| 6,324,485 B1 | 11/2001 | Ellis | |
| 6,374,338 B1 | 4/2002 | Garvey | |
| 6,376,634 B1 | 4/2002 | Nishikawa et al. | |
| 6,484,299 B1 * | 11/2002 | Larsen | 716/6 |
| 2002/0106822 A1 * | 8/2002 | Kim et al. | 438/18 |

OTHER PUBLICATIONS

Sim et al., "Modeling of PCB Variations and its Impact on Microcontroller Immunity," IEEE, Sep. 1997, pp. 100–104.
Shi et al., "Modeling Multilayered PCB Power–Bus Designs Using an MPIE Based Circuit Extraction Technique," IEEE, 1998, pp. 647–651.

* cited by examiner

*Primary Examiner*—Vuthe Siek
(74) *Attorney, Agent, or Firm*—TraskBritt

(57) ABSTRACT

A method and apparatus are provided for compensating propagation delay in an electronic system relating to corresponding signals becoming skewed by variations in the dielectric materials over which the respective, corresponding signals travel. Compensation for the propagation delay is done by selecting printed circuit boards which each have one side comprised of a dielectric substrate material exhibiting a first dielectric constant and another side comprised of a dielectric substrate material exhibiting a second dielectric constant. By transmitting each of the corresponding signals across a side of a printed circuit board with a first dielectric constant and a side with a second dielectric constant, the signals are each delayed substantially the same by the effects of the dielectric constant, reducing the skew to zero. In specific application, the printed circuit boards are most easily matched by selecting printed circuit boards from a common printed circuit board panel or array.

24 Claims, 7 Drawing Sheets

METHOD AND APPARATUS FOR PCB ARRAY WITH COMPENSATED SIGNAL PROPAGATION

CROSS-REFERENCE TO RELATED APPLICATION

This application is a continuation of application Ser. No. 09/612,155, filed Jul. 7, 2000, now U.S. Pat. No. 6,484,299, issued Nov. 19, 2002.

BACKGROUND OF THE INVENTION

1. Field of the Invention

The present invention relates generally to a method and apparatus for compensating or deskewing signal propagation within a printed circuit board ("PCB"). More particularly, the present invention relates to aligning both the rising and falling edges of the system clock, the control signals and the data input and output separately using signal delay elements.

2. State of the Art

As the complexity and data processing speeds of electronic products continue to increase, the properties of the interconnecting circuitry which connects complex and high-speed integrated circuit devices become more pronounced and must be more carefully analyzed and characterized to ensure reliable circuit performance. This increases the cost of fabricating the devices, particularly with regard to the interconnecting circuitry. The data processing speeds obtainable with advanced high-speed integrated circuit devices often dictate the required characteristics of the interconnecting circuitry, and thus can significantly increase the cost of such devices. Currently, integrated circuit devices may operate with a throughput in gigabits per second resulting in pulse durations of less than a nanosecond and rise times in the picosecond range. Under these conditions, even the conductors connecting components within these devices effectively become active components in the circuits, both in terms of affecting propagation delays and impedance matching. Logic circuits are not capable of high-speed circuit operations unless the effects of signal transmission propagation delay are somehow controlled.

Propagation delays are affected by interconnecting circuitry such as printed circuit boards and assemblies, principally as a result of the dielectric constant ($\epsilon_r$) of the materials used in the circuitry. In particular, materials having low dielectric constants are desirable as they minimize propagation delays and thereby increase the range of obtainable signal speeds within a circuit.

Impedance, which is also a function of the dielectric constant ($\epsilon_r$) of the material used in the circuitry, also affects the obtainable signal speeds within a circuit. Impedance is principally the combination of resistance, capacitance and inductance which create electric and magnetic fields in a circuit. The impedance of a circuit is also called the characteristic impedance, as it depends solely on the characteristics of the materials used and their spatial relationship. Factors such as the dielectric constants of circuit materials and the widths of conductive signal traces primarily affect the characteristic impedance of an electronic circuit.

Matching the impedances of interconnecting circuitry with that of other electronic devices and connectors is often done in an attempt to ensure signal integrity in a circuit. This is because, particularly at high frequencies, signals may be reflected when impedance mismatches are present in a circuit. Such mismatches distort signals, increase rise times, and otherwise generate errors in data transmission. Consequently, impedance matching is often necessary to provide maximum power transfer between the connected electronic components and systems and to prevent signal reflections from forming along the signal paths.

As noted above, impedance in a printed circuit is directly related to the separation between signal traces separated by an insulating layer, as well as to the dielectric constant of the material in the insulating layer. The impedance of a given printed circuit board trace where the width is greater than the height of the trace are described by the following equations:

$$Zo = 120\pi/[(W_{eff}/h) + 1.393 + 0.667 * \ln[(W_{eff}/h) + 1.44]] * (\epsilon_{eff})^{1/2}$$

$$\epsilon_{eff} = [(\epsilon_r + 1)/2] + [(\epsilon_r - 1)/2] * [1 + ((12*h)/w)]^{-1/2} - [[(\epsilon_r - 1)*(t/h)]/[4.6*(w/h)^{1/2}]]; \text{ and}$$

$$W_{eff} = w + [1.25*t/\pi] * [1 + \ln[2*h/t]]; \text{ where:}$$

Zo=Characteristic impedance;
$\epsilon_{eff}$=Effective permittivity of a microstrip trace;
$W_{eff}$=Effective width of a microstrip trace;
$\epsilon_r$=Relative permittivity of material between trace and ground plane;
h=Trace height over ground;
w=Trace width; and
t=Trace thickness.

Propagation delay, which is also related to the characteristics of the printed circuit board components, is described by the following equation:

$$Vp = 84.72 * 10^{-12} * (\epsilon_{eff})^{1/2}; \text{ where}$$

Vp=Propagation delay; and
$\epsilon_{eff}$=Effective permittivity of a microstrip trace.

One approach to the problem of managing propagation delay is to form expensive six or eight layer printed circuit boards which internally cancel propagation delay. However, there have also been numerous other approaches to controlling propagation delay, some of which include controlling or matching impedance in more simple four layer printed circuit boards.

U.S. Pat. No. 5,892,384 to Yamada et al. (Apr. 6, 1999) discloses a timing signal generation delay circuit to delay and transmit the clock signal after it detects propagation delay differences, also called skew, from a phase shift between two compared signals. By realigning the phases of the two signals by delaying one, the skew between the signals can be adjusted.

U.S. Pat. No. 5,926,397 to Yamanouchi (Jul. 20, 1999) discloses a series of individually tailored delay adjusting elements or cells to be inserted in relay spots within a system after considering the resistance, capacitance and inductance effects of the wires on the propagation delay.

U.S. Pat. No. 5,839,188 to Pommer (Nov. 24, 1998) discloses a specialized adhesive material to control the separation between printed circuit boards in multilayer circuit board applications to control propagation delay.

U.S. Pat. No. 5,929,199 to Snow et al. (Jul. 27, 1999) discloses a specific process for lowering the dielectric constant of a polymer and using that polymer in a printed circuit to reduce propagation delay.

U.S. Pat. No. 5,785,789 to Gagnon et al. (Jul. 28, 1998) discloses multilayer printed circuit board structures having partially cured, microsphere-filled resin layers which lower the dielectric constant of the overall structure to reduce propagation delay.

U.S. Pat. No. 5,945,886 to Millar (Aug. 31, 1999) discloses a method of reducing propagation delay by matching the impedance between two lines by matching the electrical lengths of the traces on a circuit board.

Although the prior art approaches to the problem of reducing propagation delay will each likely have an effect on propagation delay, each of these approaches also requires additional or specially tailored parts and layers, or processes which significantly add to the cost of fabricating the printed circuit board. Furthermore, the prior art methods do not consider varied characteristics within a circuit board, or differences between circuit boards, for a signal that crosses multiple circuit boards such as in the circuit configuration employed with a Rambus® dynamic random access memory ("RDRAM").

SUMMARY OF THE INVENTION

The present invention addresses the problem of signal skew caused by variations in the propagation delay of corresponding signals in an electronic system. In a first embodiment of the invention, a plurality of printed circuit boards ("PCBs") for use in memory modules are defined upon a common PCB array. The PCBs are laid out such that both a plurality of the sides of the PCBs which will be used for both the first sides of memory modules and a plurality of the sides of other PCBs which will be used for the second sides of memory modules are on the common first side of the array. The corresponding second side of the PCB array also includes PCBs respectively corresponding to the PCBs on the first side. The PCB arrays are then cut into individual PCBs or memory modules. Two PCBs or memory modules are matched and placed in a system such that a first signal which travels from a memory controller and across a side of a first PCB corresponding to the first side of the PCB array also travels across the side of a second PCB corresponding to the second side of the PCB array to terminate at a termination point. Correspondingly, a second signal which originates from a memory controller and travels across the side of the first PCB corresponding to the second side of the PCB array also travels across the side of the second PCB corresponding to the first side of the PCB array before reaching its termination point. In this way, the propagation delay caused by corresponding signals traveling across printed circuit boards, made of materials having different dielectric constants, respectively is matched or compensated to substantially eliminate signal skew caused by dielectric constant variations.

In a second embodiment of the invention, a plurality of PCB arrays are defined upon a common PCB panel. The PCB arrays are arranged such that both a plurality of the sides of the arrays which will be used for the first sides of memory modules and a plurality of the sides of other arrays which will be used for the second sides of memory modules are on the common first side of the panel. The corresponding second side of the panel also includes sides of the arrays respectively corresponding to the sides of the arrays on the first side of the panel. The panels are then cut into individual arrays and further into individual PCBs or memory modules. As in the previous embodiment, two PCBs or memory modules are matched and placed in a system such that a first signal which travels across a side of a first PCB corresponding to the first side of the PCB panel also travels across the side of a second PCB corresponding to the second side of the PCB panel. Correspondingly, a second signal which travels across the side of the first PCB corresponding to the second side of the PCB panel also travels across the side of the second PCB corresponding to the first side of the PCB panel.

In a third embodiment of the invention, rather than using two separate PCBs or memory modules, a single printed circuit board is used. The printed circuit board, like those in previous embodiments and common in practice, is formed having a dielectric layer on each side of the PCB. A first circuit trace, or other conductive path, extends for a first distance along a first side of the PCB, through a via, and for a second distance on the second side of the PCB. A second circuit trace, or other conductive path, extends for a distance substantially equal to the second distance along the second side of the PCB, through a via, and, for a distance substantially equal to the first distance, continues on the first side of the PCB.

BRIEF DESCRIPTION OF THE SEVERAL VIEWS OF THE DRAWINGS

The nature of the present invention as well as other embodiments of the present invention may be more clearly understood by reference to the following detailed description of the invention, to the appended claims, and to the several drawings herein, wherein:

DETAILED DESCRIPTION OF THE INVENTION

Multilayer printed circuit boards ("PCB") typically comprise layers of resin-impregnated woven glass reinforcement (prepreg) sandwiched between conductive layers of copper foil. The dielectric constant ($\epsilon_r$) of conventional FR4 epoxy resin and that of common woven glass fiber laminate prepregs is generally on the order of about four to six, respectively. For example, a resin/glass fabric laminate, typically contains about forty percent by weight of glass fabric and about sixty percent by weight of an epoxy resin material. Such laminate prepregs feature a dielectric material having a dielectric constant of approximately 4.6. Plain woven glass fabric has a dielectric constant of about 6.1. Typical raw resin has a dielectric constant of about 3.8. Air has a dielectric constant of 1.

Even when using a particular controlled process for forming a printed circuit board of a particular dielectric material, the dielectric constant of the dielectric material layer disposed between the copper traces and the ground or power layer may typically vary from between 3.8 to 4.8. In some cases, the dielectric constant may even vary as low as 3.0 or as high as 6.0. If a more precise range is desired or required for a particular application, the cost of fabrication and classification increases. As would be expected, the cost significantly increases if an exact match in the dielectric constant of the material between the copper traces and the ground or a power layer is required for each side of the PCB.

Figure 1:
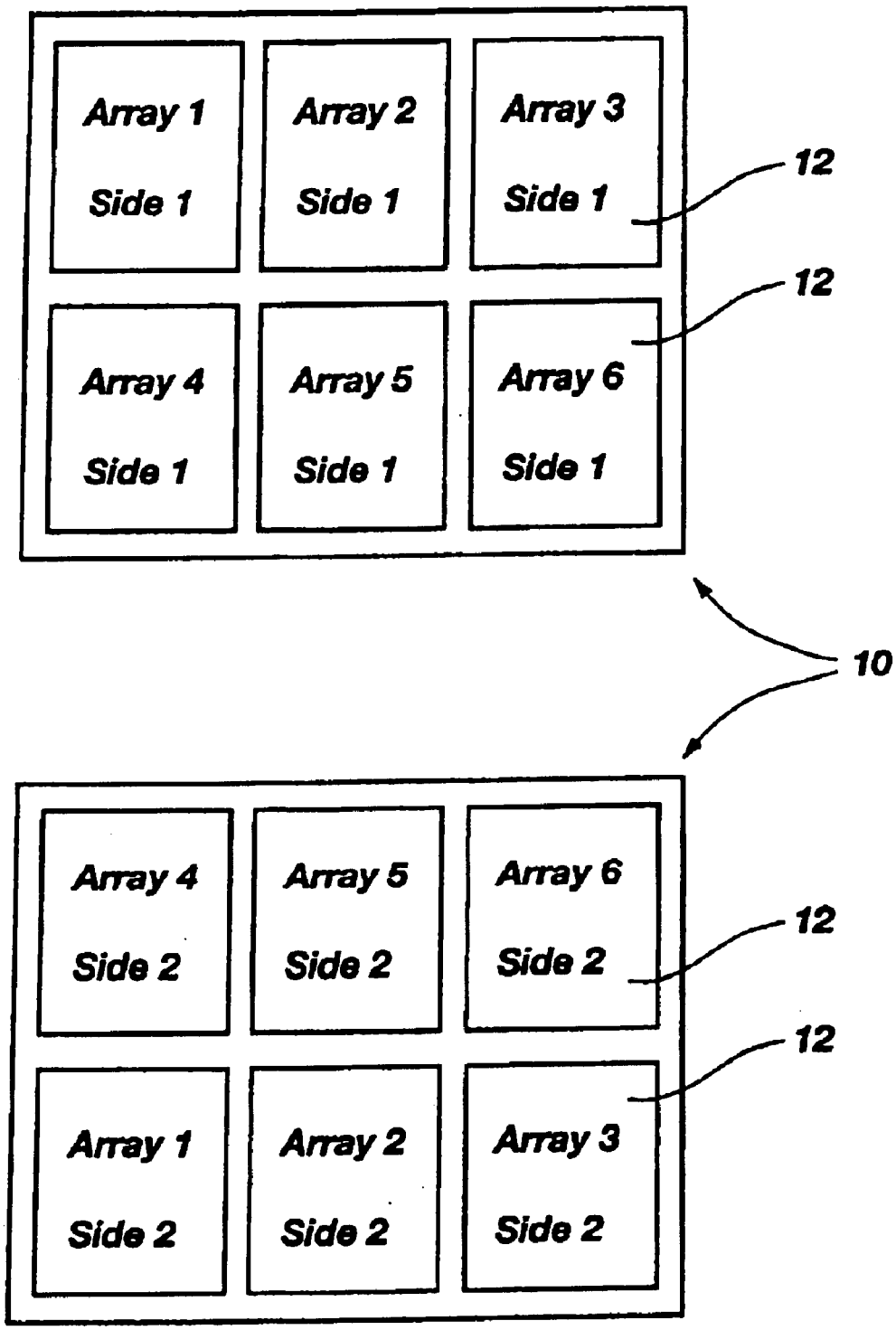
FIG. 1 is an overhead view of both sides of a prior art printed circuit board (PCB) panel layout comprising multiple arrays which, in turn, each comprise multiple PCBs.
Figure 2:
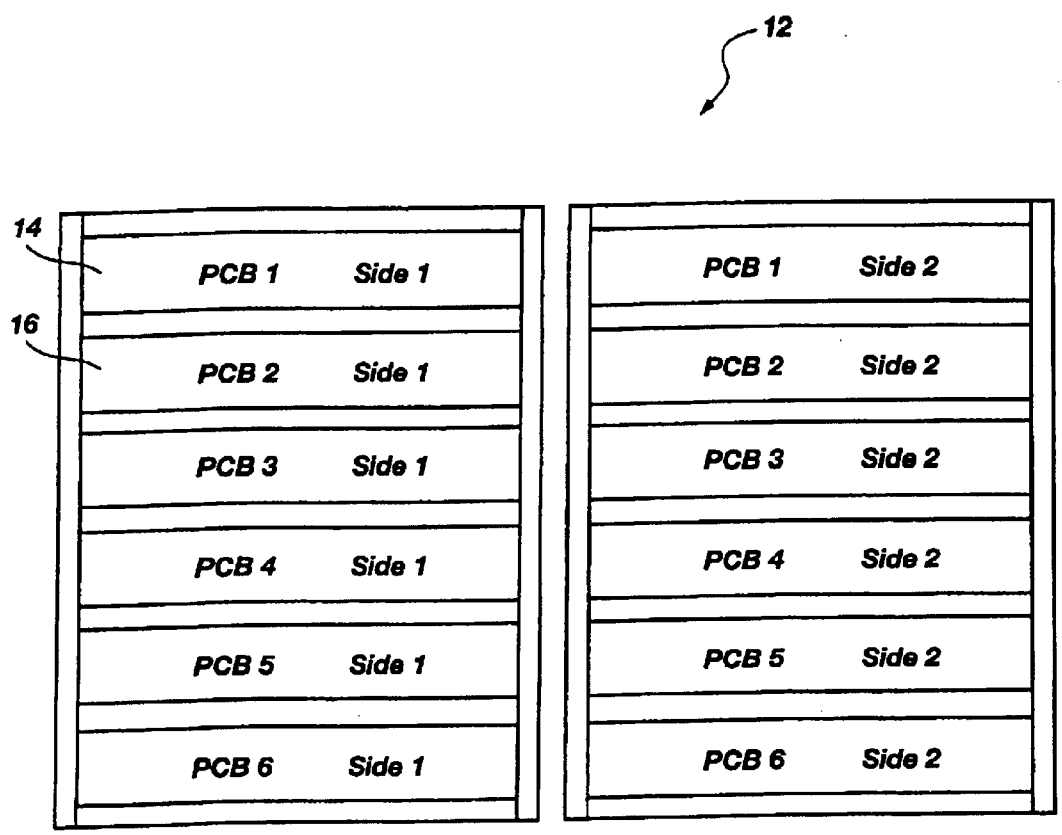
FIG. 2 is an overhead view of both sides of a prior art PCB array layout comprising multiple PCBs.

Multilayer PCBs are typically formed by adhering large sheets of material to surfaces of other large sheets of material to form large multilayer panels. As shown in FIG. 1, these large multilayer panels 10, by design, are then cut into smaller arrays 12. The panel 10, shown in FIG. 1, is a 24"×20" panel, which may be cut to form six smaller arrays 12. Depending upon the application in which the PCB will be used, varying sizes of panels and sizes of arrays are available and well known in the art. FIG. 2 illustrates a layout on an array 12 for forming the array 12 into smaller PCBs, such as PCB 1 14 and PCB 2 16. The outermost copper layers on the PCB can be etched in a circuit pattern corresponding to the intended use of the PCB using conventional methods known in the art such as plasma etching and wet etching at the panel level, the array level, or even the PCB level. For efficiency and cost, it is most preferred to etch the traces into the material before they are cut into individual arrays. The PCBs then conventionally have a Rambus memory die attached to them to form RIMM modules for use in two- or three-RIMM module groupings within a Rambus-type system.

Figure 3:
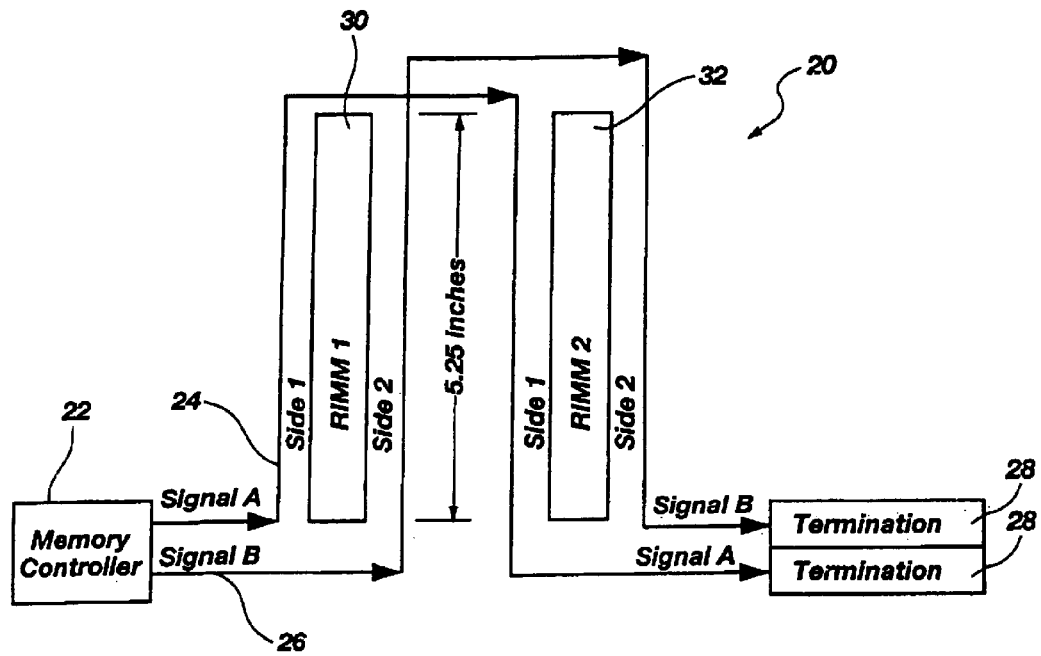
FIG. 3 is a block diagram of a two-RIMM Rambus-type memory system illustrating the routes the signals travel through the individual RIMMs.

FIG. 3 is a block diagram of a two-RIMM Rambus-type system 20 comprising a memory controller 22 having at least two signal paths, Signal A 24 and Signal B 26, a termination 28 for each signal path 24 and 26, and two RIMMs, RIMM 1 30, and RIMM 2 32. The signal paths 24 and 26 are illustrated separate from the RIMMs 30 and 32 for clarity of illustration. However, portions of the signal paths 24 and 26 are, in fact, etched onto the RIMMs 30 and 32 on the respective side nearest the signal path illustrated. As discussed previously, each RIMM is a multilayer RIMM having both a side 1 and a side 2, each of the two sides conventionally having a different dielectric constant associated with it. In a typical Rambus-type system 20, Signal A 24, after it leaves the memory controller 22, travels the length of side 1 of RIMM 1 30 and then the length of side 1 of RIMM 2 32 before reaching its termination 28. Similarly, Signal B 26, after it leaves the memory controller 22, travels the length of side 2 of RIMM 1 30 and then the length of side 2 of RIMM 2 32 before reaching its termination 28.

Figure 4:
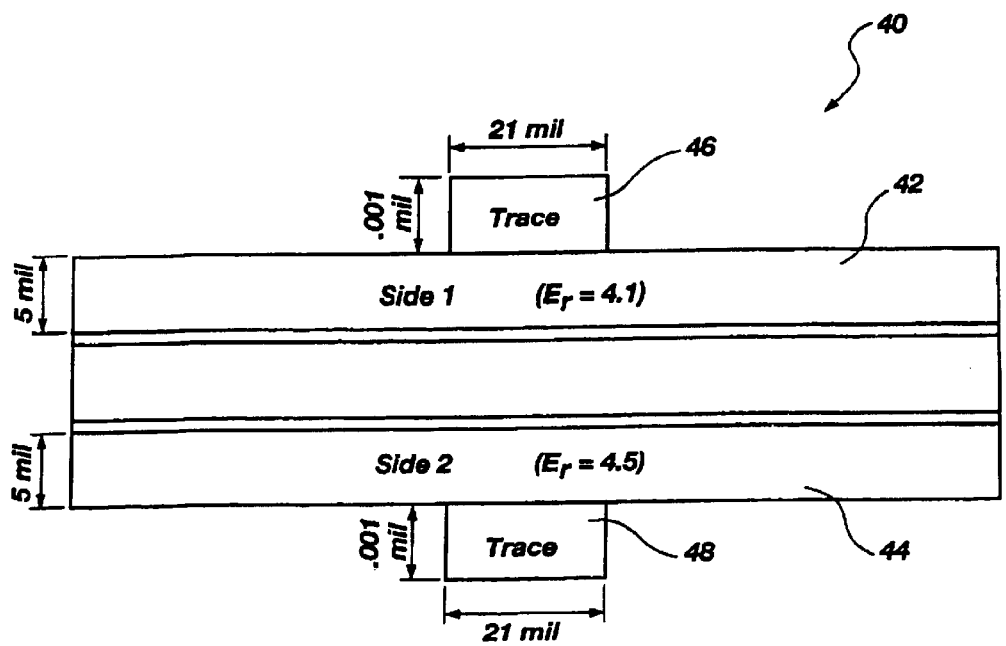
FIG. 4 is a cross-sectional view of a four-layer PCB microstrip.

FIG. 4 depicts a cross-sectional drawing (not-to-scale) of a four-layer PCB microstrip 40 having the characteristics shown. Most significantly, as is typical, Side 1 42 of the PCB microstrip 40 has a different dielectric constant than Side 2 44. As a result, using the propagation delay equations discussed previously and the values shown in FIG. 4, a signal traveling along the trace 46 on Side 1 42 of the PCB microstrip 40 will have a propagation delay of 153.3 ps/in, while a signal traveling along the trace 48 on Side 2 44 of the PCB microstrip 40 will have a propagation delay of 160.0 ps/in. For the two-RIMM Rambus-type system 20 shown in FIG. 3, assuming similar characteristics for both RIMM 1 30 and RIMM 2 32, the difference between the propagation delays of the two signals after each travels the length of a side of each of the two RIMMs is:

$$\begin{aligned}
\text{Total Skew} = &[(RIMM\ 1/\text{Side 1 Prop. Delay})*\text{Side 1 length} + \\
&(RIMM\ 2/\text{Side 1 Prop. Delay})*\text{Side 1 length}] - \\
&[(RIMM\ 2/\text{Side 2 Prop. Delay})*\text{Side 2 length} + \\
&(RIMM\ 2/\text{Side 2 Prop. Delay})*\text{Side 2 length}] \\
= &\,|[(153.3\ \text{ps/in}*5.25\ \text{in}) + (153.3\ \text{ps/in}*5.25\ \text{in})] - \\
&[(160.0\ \text{ps/in}*5.25\ \text{in}) + (160.0\ \text{ps/in}*5.25\ \text{in})]| \\
= &\,70.35\ \text{ps}
\end{aligned}$$

As data speeds become faster, the restrictions on how separated, or skewed, a signal can be from its companion signal becomes more and more significant. For example, the Rambus-type system presently has a maximum skew specification rating of 150 ps. For the system of FIG. 4, at a total skew of 70.35 ps for the signals traveling along only the two RIMMs, the system would quickly exceed the skew indicative of the 150 ps rating.

Figure 5:
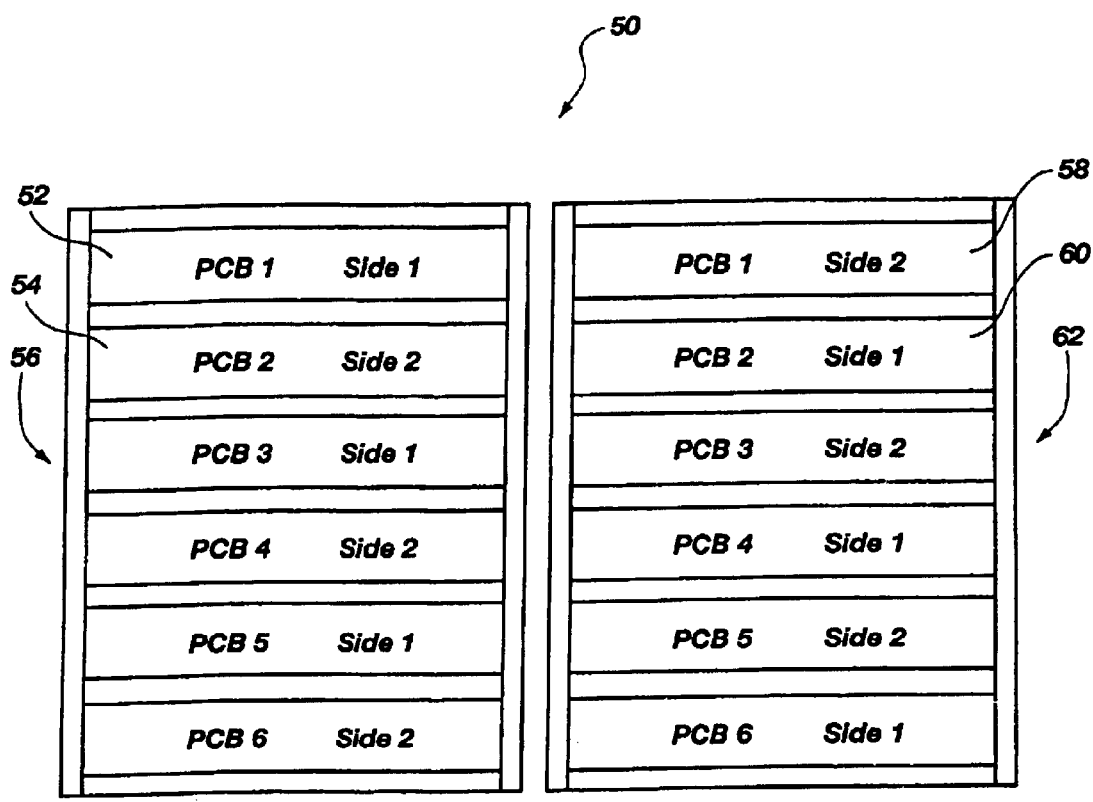
FIG. 5 is an overhead view of a PCB array layout according to a first preferred embodiment of the invention.

The present invention overcomes much of the skew problem by taking advantage of the layout of a typical Rambus-type system and the fairly uniform nature of the dielectric constant ($\epsilon_r$) within a sheet of printed circuit board material. As shown in FIG. 5, according to a first preferred embodiment of the invention, an array 50 is etched and cut in an alternating pattern of traces such that the printed circuit board (PCB) that will be used for Side 1 52 of RIMM 1 and the PCB that will be used for Side 2 54 of RIMM 2 come from the same first side 56 of the array 50 and thus have substantially the same dielectric constant. Furthermore, by default, the PCB that will be used for Side 2 58 of RIMM 1 and the PCB that will be used for Side 1 60 of RIMM 2 come from the same second side 62 of the array 50 and thus also have substantially the same dielectric constant, whether it be the same or different from the dielectric constant of the first side 56 of the array 50.

Under this first preferred embodiment of the invention, when the array laid out in this pattern is cut into a plurality of PCBs, each PCB then having a Rambus die attached and being placed into a Rambus-type system 20 configuration such as that shown in FIG. 3, the propagation delay caused along RIMM 1 30 is compensated for along RIMM 2 32 by eliminating the skew. Thus, the total skew after Signal A 24 and Signal B 26 each travel the lengths of the two RIMMs 30 and 32 is:

$$\begin{aligned}
\text{Total Skew} = &[(RIMM\ 1/\text{Side 1 Prop. Delay})*\text{Side 1 length} + \\
&(RIMM\ 2/\text{Side 1 Prop. Delay})*\text{Side 1 length}] - \\
&[(RIMM\ 2/\text{Side 2 Prop. Delay})*\text{Side 2 length} + \\
&(RIMM\ 2/\text{Side 2 Prop. Delay})*\text{Side 2 length}] \\
= &\,|[(153.3\ \text{ps/in}*5.25\ \text{in}) + (160.0\ \text{ps/in}*5.25\ \text{in})] - \\
&[(160.0\ \text{ps/in}*5.25\ \text{in}) + (153.3\ \text{ps/in}*5.25\ \text{in})]| \\
= &\,0\ \text{ps}
\end{aligned}$$

Because the dielectric constant of the material for Side 1 52 of RIMM 1 30 is substantially the same as the dielectric constant of the material for Side 2 54 of RIMM 2 32, and the dielectric constant of the material for Side 2 58 of RIMM 1 30 is substantially the same as the dielectric constant of the material for Side 1 60 of RIMM 2 32, each of Signal A 24 and Signal B 26 (FIG. 3) travel the length of a PCB side over a material exhibiting a first dielectric constant and the length of a PCB side over a material exhibiting a second dielectric constant. In this way, the propagation delays are compensated for by the PCB system to cancel the overall skew.

There will, of course, be variances caused by other factors within the system such as neighboring components and paths, and minor variances within the dielectric material of the PCB. However, the substantial effects of the dielectric constant on the propagation delay will, for the most part, be resolved by the present invention.

Figure 6:
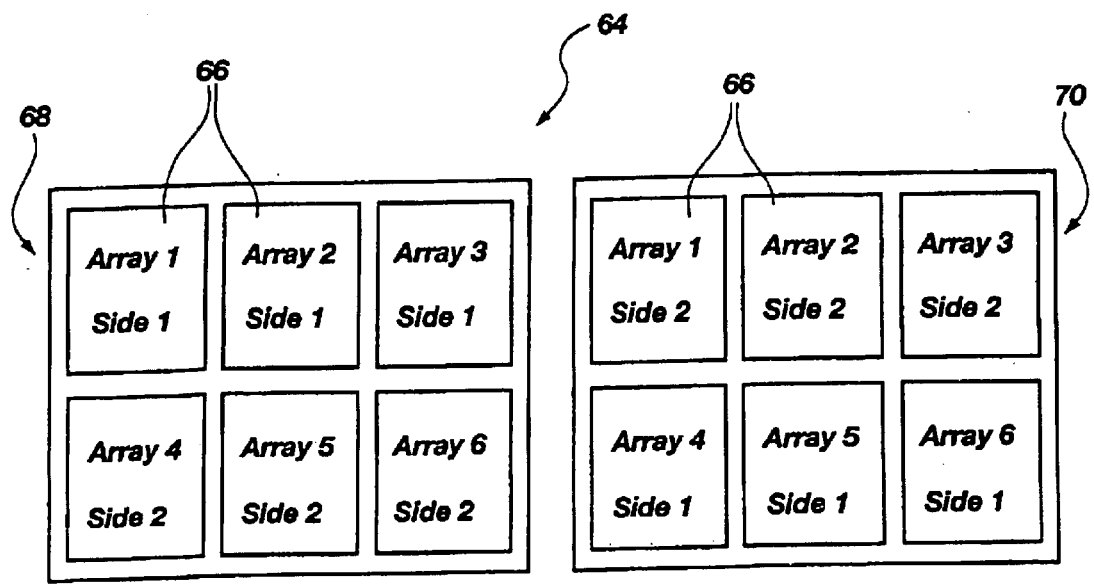
FIG. 6 is an overhead view of a PCB panel layout according to a second preferred embodiment of the invention.

In a second preferred embodiment of the invention, as illustrated in FIG. 6, a PCB panel 64 is cut such that half of the arrays 66 on a first side 68 of the panel 64 are patterned as PCBs that will each be used as Side 1 of a RIMM, and half of the arrays 66 are patterned as PCBs that will each be used as Side 2 of a RIMM. Similarly, second side 70 of the panel 64 includes arrays 66 patterned as PCB that will each be used as side 2 of a RIMM, opposite the Side 1 patterns on the first side 68, while the other half of the arrays 66 on the second side 70 lying under the Side 2 patterned arrays on the first side 68 are patterned as Side 1 PCBs. When each of the arrays are cut, individual PCBs, for example, from an array such as array 4 may be matched with the individual PCBs from an array such as array 1. Since a Side 1 of a PCB from array 1 formed on a first side 68 of a panel 64 is matched with Side 1 of a PCB from array 4 formed on a second side 70 of the panel 68 and Side 2 of the PCB from the second side 70 of array 1 is matched with a PCB bearing a Side 2 formed on a first side 68 of array 4, the propagation delays are equalized and skew is cancelled.

Figure 7:
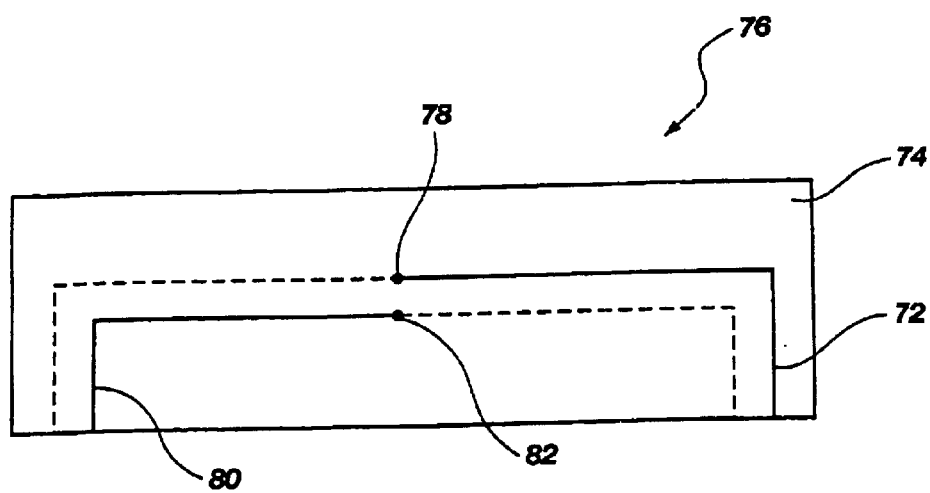
FIG. 7 is an overhead view of a PCB according to a third embodiment of the invention.

In a third embodiment of the present invention, as shown in FIG. 7, a first circuit trace 72 travels the first half of its length along a first side 74 of a printed circuit board (PCB) 76 and then travels through a first via 78 to a second side (not shown other than by dashed lines to indicate the second side traces) of the PCB 76 for the second half of its length. A second circuit trace 80 travels the first half of its length along the second side (not shown other than by dashed lines to indicate the second side traces) of the PCB 76 and then travels through a second via 82 to the first side 74 of the PCB for the second half of its length. As with the previous embodiments, transmitting signals across the dielectric material in this pattern compensates for the propagation delay, which is heavily affected by the dielectric constant of the dielectric material over which the signals travel. The PCB system compensates for the propagation delay by allowing multiple signals to travel over material with the same dielectric constant without the cost of setting the specifications for the material so narrowly. FIG. 7 shows the circuit traces 72 and 80 laterally spaced from each other to more easily distinguish between the traces. However, to more closely match the lengths of the traces over the same dielectric material, the circuit trace patterns are preferably placed very close together or, because they are traveling on opposite sides of the PCB 76, most preferably, placed along a mirrored path with minor variances at a midpoint to allow the signals to be isolated from each other as they pass through vias 78 and 82.

Figure 8:
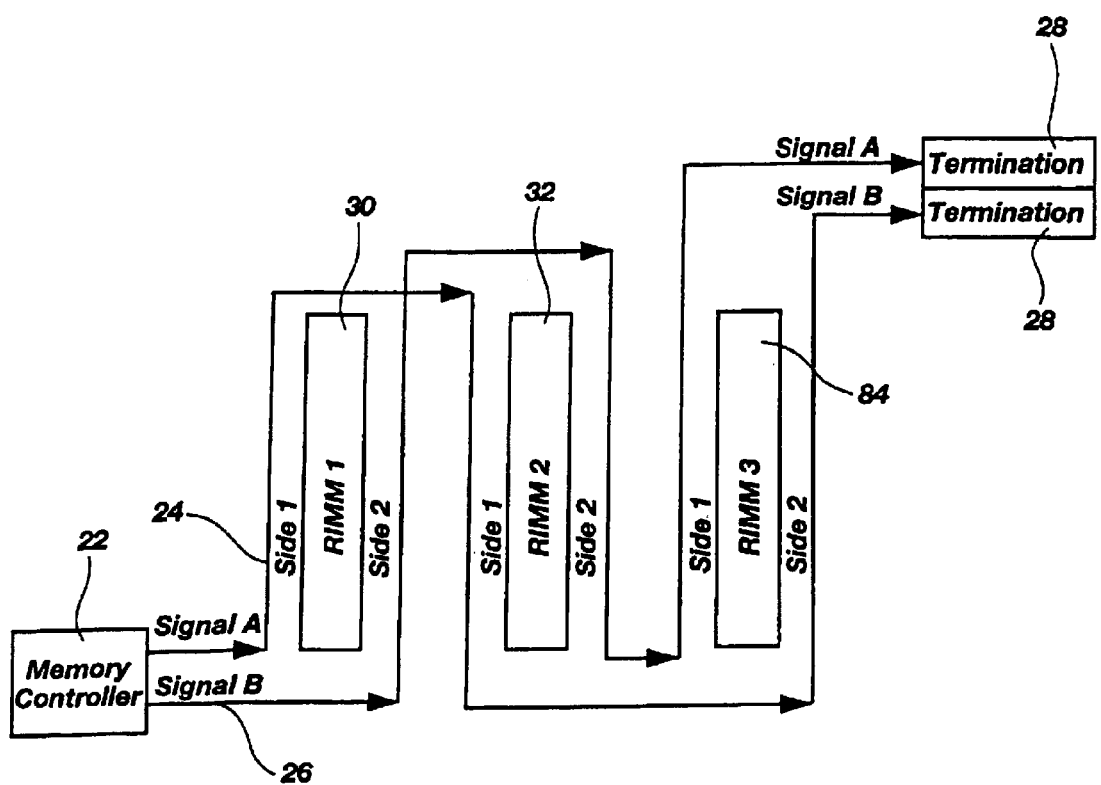
FIG. 8 is a block diagram of a three-RIMM Rambus-type memory system.

FIG. 8 shows a Rambus-type system configuration like that of FIG. 3 using RIMMs fabricated from PCBs patterned and cut as with the array 50 depicted in FIG. 5, but including a third RIMM 84. In the embodiment shown in FIG. 8, as with the previously described embodiments, the skew between respective Signals A 24 and B 26 caused by the different dielectric constants of the material used for Sides 1 and 2 of RIMM 1 30 is compensated for by a different skew caused by the different dielectric constants of the material used for Sides 1 and 2 of RIMM 2 32. Because RIMM 2 32 compensates for the propagation delay of RIMM 1 30 by canceling the skew, there is, effectively, no skew present between the respective Signals A 24 and B 26 as they enter RIMM 3 84. In this embodiment, because there is no fourth RIMM to compensate for any skew caused by the different dielectric materials in Sides 1 and 2 of RIMM 3 84, there is no particular need to select RIMM 3 84 from a particular array or having particular dielectric constants, so long as the skew caused by Signals A 24 and B 26 traveling along different sides of RIMM 3 84 does not exceed the overall tolerance allowed for the system. Therefore, while the PCBs used for RIMM 1 30 and RIMM 2 32 should be matched by coming from the same panel or same array according to the present invention, RIMM 3 84 may be from the same, or a different panel or array. A PCB patterned according to the embodiment shown in FIG. 7 and described in relation thereto, however, would be advantageous as RIMM 3 84 because it does not require a second, matching RIMM to compensate for the propagation delay caused by the dielectric materials used for the respective sides of the PCB of that RIMM.

Contrarily, if a fourth RIMM were used in the system shown in FIG. 8, it would most preferably be fabricated from a PCB patterned and cut as with the array 50 depicted in FIG. 5 such that the propagation delay caused by the respective signals traveling along the dielectric constants of the material used for the respective sides of RIMM 4 could compensate for the propagation delay caused by RIMM 3 84 as discussed with the various embodiments of the present invention. As will be clear to one of skill in the art, for any even number of printed circuit boards used in a system, the boards may be matched according to this invention to cancel skew.

As will further be clear to one of skill in the art, the specific alternating patterns of RIMM sides and array sides shown and discussed in relation to the foregoing Figures are not required to achieve the advantages of the present invention. It is most preferable to match RIMMs which were physically closer in location to each other on a given PCB layout of an array or panel before they were cut to ensure, in most instances, a closer match of dielectric constants within a specific PCB. It is believed, however, that there is sufficient uniformity of the dielectric constant within a given side of a PCB panel or array to match a RIMM or array with one anywhere on the same PCB panel or array. This matching of PCBs used for specific RIMMs, therefore, may be accomplished using any number of patterns of alternating or adjacent PCBs within common arrays or panels.

Figure 9:
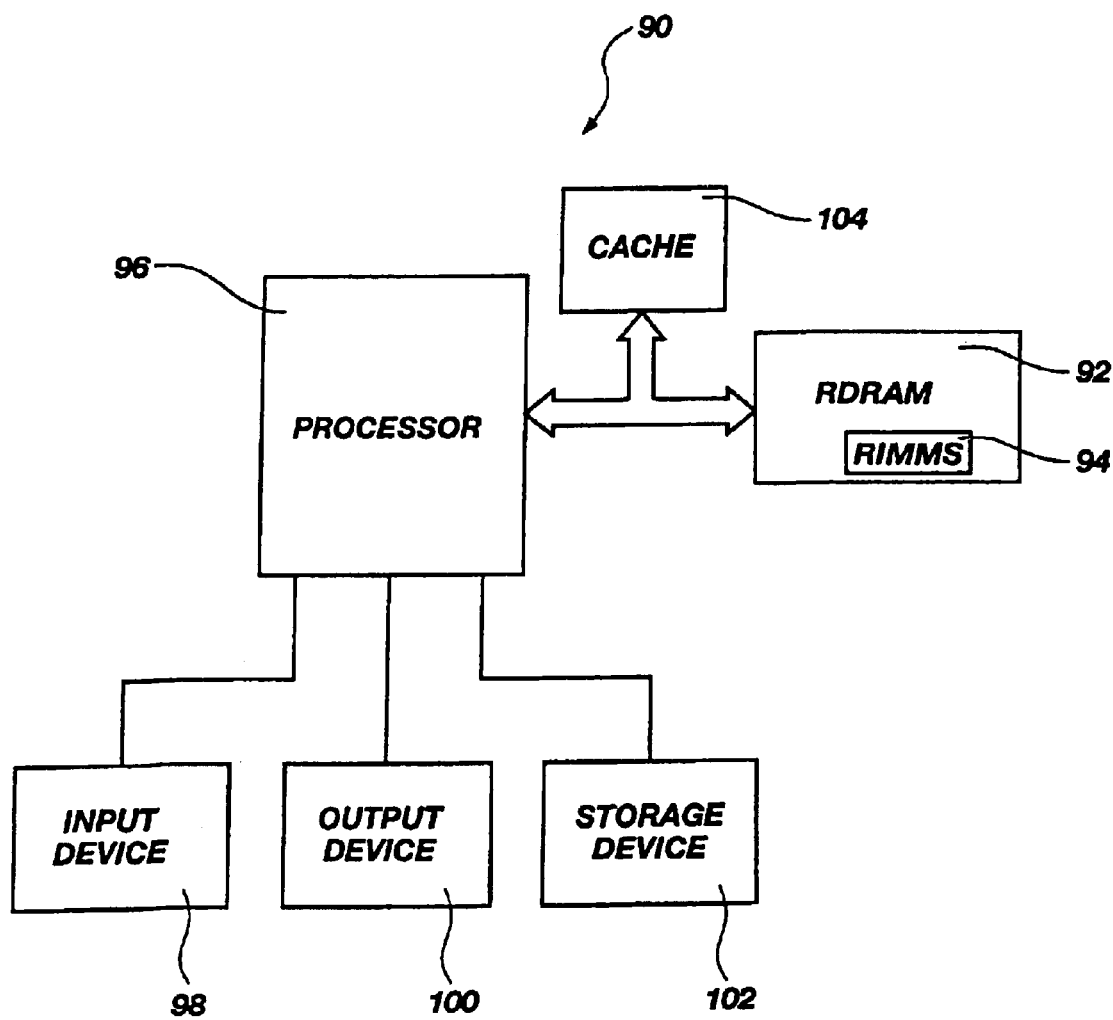
FIG. 9 is a block diagram of an electronic system including memory fabricated according to an embodiment of the present invention.

FIG. 9 is a block diagram of an electronic system 90 which includes RDRAM 92 comprising RIMMs 94 including at least two printed circuit boards matched according to the invention. The electronic system 90 includes a processor 96 for performing various computing functions, such as executing specific software to perform specific calculations or tasks. Additionally, the electronic system 90 includes one or more input devices 98, such as a keyboard or a mouse, coupled to the processor 96 to allow an operator to interface with the electronic system 90. Typically, the electronic system 90 also includes one or more output devices 100 coupled to the processor 96, such output devices typically being a printer, a video terminal or a network connection. One or more data storage devices 102 are also typically coupled to the processor 96 to store data or retrieve data from external storage media (not shown). Examples of typical storage devices 102 include hard and floppy disks, tape cassettes, and compact disks. The processor 96 is also typically coupled to a cache memory 104, which is conventionally static random access memory ("SRAM"), and to the RDRAM 92. It will be understood, however, that the propagation delay compensated printed circuit boards of the invention may also be incorporated into any one of the processor, input, output, storage, and cache devices 96, 98, 100, 102 and 104, respectively.

One potential added expense with using the method of the present invention is the expense of tracking the individual arrays and RIMMs by the array or panel from which they came. However, if the processes for creating the dielectric sheets for use in the printed circuit boards (PCB) can reliably ensure a dielectric constant within an acceptable range, there would be no further need to determine if the dielectric constant of the material is beyond that range to specifically match it with another dielectric sheet. The present invention allows for differences between the dielectric sheets used for a specific panel without requiring the additional cost of matching the dielectric constants of the sheets. Therefore, even in light of the added expense of tracking the individual arrays and RIMMs by the panel or array from which they came, the present invention will likely reduce total cost and certainly provide greater product reliability and repeatability of performance. The arrays or individual PCBs for use as RIMMs may be marked at the time of fabrication, such as by bar coding or merely by numbers, lasers or other indicia visible to an operator to distinguish them later.

Although the invention is shown and described primarily with reference to Rambus-type memory systems using RDRAM, the use of the present invention to compensate for skew in other memory or nonmemory systems are also contemplated within the scope of this disclosure. It is believed that adaptation from the disclosure herein to different architectures and applications will be clear to one of skill in the art. The invention helps reduce propagation delay caused by signal travel through different signal paths of a printed circuit board. Therefore, the present invention will be advantageous in any electronic system where compensation for differences in propagation delay along different signal paths is desired.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

What is claimed is:

1. A method of matching signal propagation between a first signal and a second signal within an electronic system, said method comprising:

electrically conductively coupling said first signal to both a first dielectric material having a first dielectric constant and a second dielectric material having a second dielectric constant different from said first dielectric constant; and electrically conductively coupling said second signal to both a third dielectric material having a third dielectric constant substantially equal to said second dielectric constant and a fourth dielectric material having a fourth dielectric constant substantially equal to said first dielectric constant.

2. The method, as recited in claim 1, further comprising electrically conductively coupling said first signal and said second signal to a memory controller.

3. The method, as recited in claim 1, wherein coupling said first signal to both said first dielectric material and said second dielectric material further comprises electrically coupling said first signal from said first dielectric material to said first signal on said second dielectric material through a first via.

4. The method, as recited in claims wherein coupling said second signal to both said third dielectric material and said fourth dielectric material further comprises electrically coupling said second signal from said third dielectric material to said second signal on said fourth dielectric material through a second via.

5. A method of matching signal propagation between a first signal and a second signal, said method comprising:

electrically coupling said first signal to both a first dielectric material having a first propagation delay and a second dielectric material having a second propagation delay different from said first propagation delay; and electrically coupling said second signal to both a third dielectric material having a third propagation delay substantially equal to said second propagation delay and a fourth dielectric material having a fourth propagation delay substantially equal to said first propagation delay.

6. A method of matching signal propagation between a first signal and a second signal within an RDRAM system, said method comprising:

selecting a first RIMM comprising a first side for routing said first signal thereon, said first side characterized by a first dielectric material having a first propagation delay associated therewith, and a second side for routing said second signal thereon, said second side characterized by a second dielectric material having a second propagation delay associated therewith different from said first propagation delay, and selecting a second RIMM comprising a first side for further routing said first signal thereon, said first side characterized by said second dielectric material having a third propagation delay associated therewith, and a second side for further routing said second signal thereon, said second side characterized by said first dielectric material having a fourth propagation delay associated therewith, said third propagation delay being substantially similar to said second propagation delay and said fourth propagation delay being substantially similar to said first propagation delay.

7. The method, as recited in claim 6, further comprising:

transmitting said first signal along said first side of said first RIMM and along said first side of said second RLMM; and transmitting said second signal along said second side of said first RJMM and along said second side of said second RIMM.

8. An electronic system comprising:

a memory controller;

at least one signal termination;

a first memory module including a circuit board having a first side characterized by a first dielectric material having a first propagation delay associated therewith and a second side characterized by a second dielectric material having a second propagation delay associated therewith different from said first propagation delay;

a second memory module including a circuit board having a first side characterized by said second dielectric material having a third propagation delay associated therewith and a second side characterized by said first dielectric material having a fourth propagation delay associated therewith, said third propagation delay being substantially similar to said second propagation delay and said fourth propagation delay being substantially similar to said first propagation delay;

at least a first conductive path extending from said memory controller, along a portion of said first side of said first memory module and a portion of said first side of said second memory module, to at least a first of said at least one signal termination; and at least a second conductive path extending from said memory controller, along a portion of said second side of said first memory module and a portion of said second side of said second memory module, to at least a second of said at least one signal termination.

9. The electronic system of claim 8, wherein said first memory module and said second memory module are each RIMMs.

10. The electronic system of claim 8, wherein said first memory module and said second memory module are both modules from a common printed circuit board array.

11. The electronic system of claim 8, wherein said first memory module and said second memory module are both modules from a common printed circuit board panel.

12. The electronic system of claim 8, wherein said at least a first conductive path and said at least a second conductive path comprise circuit traces on a printed circuit board.

13. An electronic system comprising:

at least a first conductive path having a first portion adjacent a first portion of a dielectric material characterized by a first propagation delay associated therewith, and a second portion adjacent a first portion of a dielectric material characterized by a second propagation delay associated therewith; and at least a second conductive path having a first portion adjacent a second portion of said dielectric material characterized by said first propagation delay and a second portion adjacent a second portion of said dielectric material characterized by said second propagation delay.

14. The electronic system of claim 13, wherein said at least a first conductive path and said at least a second conductive path are printed circuit board traces and said dielectric material characterized by said first propagation delay and said dielectric material characterized by said second propagation delay are each layers in at least one printed circuit board structure.

15. The electronic system of claim 14, wherein said at least one printed circuit board structure is a printed circuit board panel.

16. The electronic system of claim 14, wherein said at least one printed circuit board structure is a printed circuit board array.

17. A computer system comprising:

a processor;

an input device coupled to said processor and adapted to allow data to be input to said processor;

an output device coupled to said processor and adapted to allow said processor to output data;

a storage device coupled to said processor adapted to store information for use by said processor; and a memory device coupled to said processor for storing data and instructions for use by said processor, said memory device comprising:

at least a first memory module including a printed circuit board having a first side characterized by a first dielectric material having a first propagation delay associated therewith and a second side characterized by a second dielectric material having a second propagation delay associated therewith different from said first propagation delay;

at least a second memory module including a printed circuit board having a first side characterized by said second dielectric material having a third propagation delay associated therewith, and a second side characterized by said first dielectric material having a fourth propagation delay associated therewith, said third propagation delay being substantially similar to said second propagation delay and said fourth propagation delay being substantially similar to said first propagation delay;

at least a first conductive path extending a length of said first side of said at least a first memory module and a length of said first side of said at least a second memory module; and at least a second conductive path extending a length of said second side of said at least a first memory module and a length of said second side of said at least a second memory module.

18. The computer system of claim 17, wherein said memory device is an RDRAM device and said at least a first memory module and said at least a second memory module are each RIMMs.

19. The computer system of claim 17, wherein said at least a first memory module and said at least a second memory module each comprise printed circuit boards from a common printed circuit board panel.

20. The computer system of claim 19, wherein said at least a first memory module and said at least a second memory module each comprise printed circuit boards from a common printed circuit board array.

21. The computer system of claim 19, wherein said at least a first memory module and said at least a second memory module each comprise printed circuit boards from different printed circuit board arrays.

22. A method of making a memory module system, said method comprising:

selecting a first printed circuit board including a first side characterized by a first dielectric material having a first propagation delay associated therewith and a second side characterized by a second dielectric material having a second propagation delay associated therewith different from said first propagation delay;

selecting a second printed circuit board including a first side characterized by said second dielectric material having a third propagation delay associated therewith and a second side characterized by said first dielectric material having a fourth propagation delay associated therewith, said third propagation delay being substantially similar to said second propagation delay and said fourth propagation delay being substantially similar to said first propagation delay;

extending a first conductive trace over said first side of each of said first and second printed circuit boards; and extending a second conductive trace over said second side of each of said first and second printed circuit boards.

23. The method of claim 22, wherein selecting comprises selecting said first and second printed circuit boards from a common printed circuit board panel on which each is fabricated.

24. The method of claim 22, wherein selecting comprises selecting said first and second printed circuit boards from a common printed circuit board array on which each is fabricated.

* * * * *

UNITED STATES PATENT AND TRADEMARK OFFICE
CERTIFICATE OF CORRECTION

PATENT NO. : 6,817,002 B2
APPLICATION NO. : 10/224102
DATED : November 9, 2004
INVENTOR(S) : Corey L. Larsen It is certified that error appears in the above-identified patent and that said Letters Patent is hereby corrected as shown below:

In the claims:

| | | | |
|---|---|---|---|
| CLAIM 4, | COLUMN 10, | LINE 1, | change "claims" to --claim 3,-- |
| CLAIM 7, | COLUMN 10, | LINE 45, | change "RLMM; to --RIMM;-- |
| CLAIM 7, | COLUMN 10, | LINE 47, | change "RJMM" to --RIMM-- |

Signed and Sealed this

Nineteenth Day of February, 2008

JON W. DUDAS
*Director of the United States Patent and Trademark Office*